(12) United States Patent
Leon

(10) Patent No.: US 6,525,569 B1
(45) Date of Patent: Feb. 25, 2003

(54) DRIVER CIRCUIT HAVING SHAPABLE TRANSITION WAVEFORMS

(75) Inventor: Wu Leon, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/957,913

(22) Filed: Sep. 21, 2001

(51) Int. Cl.[7] .................. H03K 19/0175; H03K 19/003
(52) U.S. Cl. .......................................... 326/83; 326/29
(58) Field of Search .............................. 326/83, 86–87, 326/26–30; 327/170, 112

(56) References Cited

U.S. PATENT DOCUMENTS

| | | | |
|---|---|---|---|
| 5,128,567 A | * | 7/1992 | Tanaka et al. ......... 257/29.141 |
| 5,165,046 A | | 11/1992 | Hesson |
| 5,206,544 A | | 4/1993 | Chen et al. |
| 5,220,216 A | * | 6/1993 | Woo .............................. 326/50 |
| 5,241,221 A | | 8/1993 | Fletcher et al. |
| 5,448,182 A | | 9/1995 | Countryman et al. |
| 5,726,583 A | | 3/1998 | Kaplinsky |
| 5,789,937 A | | 8/1998 | Cao et al. |
| 5,808,478 A | | 9/1998 | Andresen |
| 6,069,504 A | | 5/2000 | Keeth |
| 6,087,847 A | * | 7/2000 | Mooney et al. ................ 326/30 |

FOREIGN PATENT DOCUMENTS

| | | | | |
|---|---|---|---|---|
| JP | 59058911 A | * | 4/1984 | .......... H03K/3/353 |
| JP | 06-120805 | | 4/1994 | |

* cited by examiner

Primary Examiner—Michael Tokar
Assistant Examiner—James H. Cho
(74) Attorney, Agent, or Firm—Bracewell & Patterson LLP

(57) ABSTRACT

A driver circuit having shapable transition signals is disclosed. The driver circuit includes multiple branches of inverter banks connected in parallel. Each of the inverter banks includes an equal number of impedance-controllable inverters connected in series, and a capacitor can be connected between two impedance-controllable inverters within an inverter bank. Each of the impedance-controllable inverter includes an up-level impedance control and a down-level impedance control. Within an inverter bank, the impedance of the impedance-controllable inverters and the capacitance of the capacitors form a set of controlled time constants. By selecting the proper time constants, a desirable up transistor shape and a desirable down transition shape can be obtained for the driver circuit.

11 Claims, 5 Drawing Sheets

US 6,525,569 B1

DRIVER CIRCUIT HAVING SHAPABLE TRANSITION WAVEFORMS

BACKGROUND OF THE INVENTION

1. Technical Field

The present invention relates to digital circuits in general, and in particular to digital driver circuits. Still more particularly, the present invention relates to a digital driver circuit having shapable transition waveforms.

2. Description of the Prior Art

Driver circuits are commonly utilized within electronic circuits for boosting signal strengths from one circuit block to another. Referring now to the drawings and in particular to FIG. 1, there is depicted a schematic diagram of a conventional driver circuit. As shown, a driver circuit 10 includes four inverters 11–14 connected in series between an input 16 and an output 17. Each of inverters 11–14 is comprised of a p-channel transistor and an n-channel transistor connected in series between a power supply and ground.

In general, the slew rate of a waveform (in up transitions and down transitions) from a conventional driver circuit, such as driver circuit 10, is completely determined by the device characteristics of the components within the driver circuit. Furthermore, the slew rates vary widely among various driver circuits due to different fabrication processes. However, for a high-speed multi-drop circuit network having a small signal swing, it is very important to have a consistent signal transition shape and a consistent transition slew rate.

Consequently, it is desirable to provide an improved driver circuit that generates a consistent signal transition shape and a consistent transition slew rate independent of the fabrication process.

SUMMARY OF THE INVENTION

In accordance with a preferred embodiment of the present invention, a driver circuit includes multiple branches of inverter banks connected in parallel. Each of the inverter banks includes an equal number of impedance-controllable inverters connected in series, and a capacitor can be connected between two impedance-controllable inverters within an inverter bank. Each of the impedance-controllable inverter includes an up-level impedance control and a down-level impedance control. The impedance of the p-channel transistors within an impedance-controllable inverter can be adjusted via the up-level impedance control. Similarly, the impedance of the n-channel transistors within the impedance-controllable inverter can be adjusted via the down-level impedance control. Within an inverter bank, the impedance of the impedance-controllable inverters and the capacitance of the capacitors form a set of controlled time constants. By selecting the proper time constants, a desirable up transistor shape and a desirable down transition shape can be obtained for the driver circuit.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
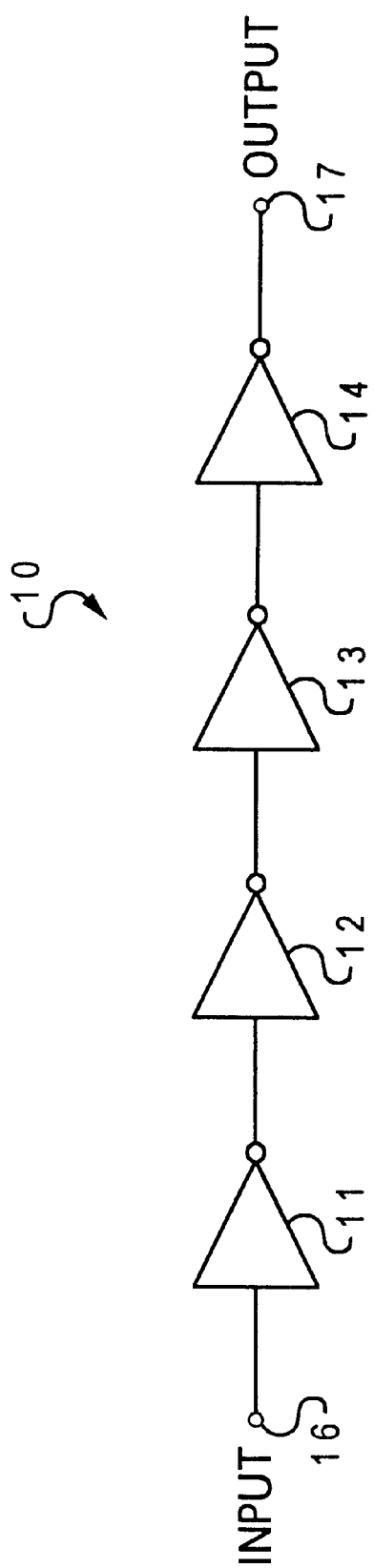
FIG. 1 is a schematic diagram of a driver circuit according to the prior art.
Figure 2:
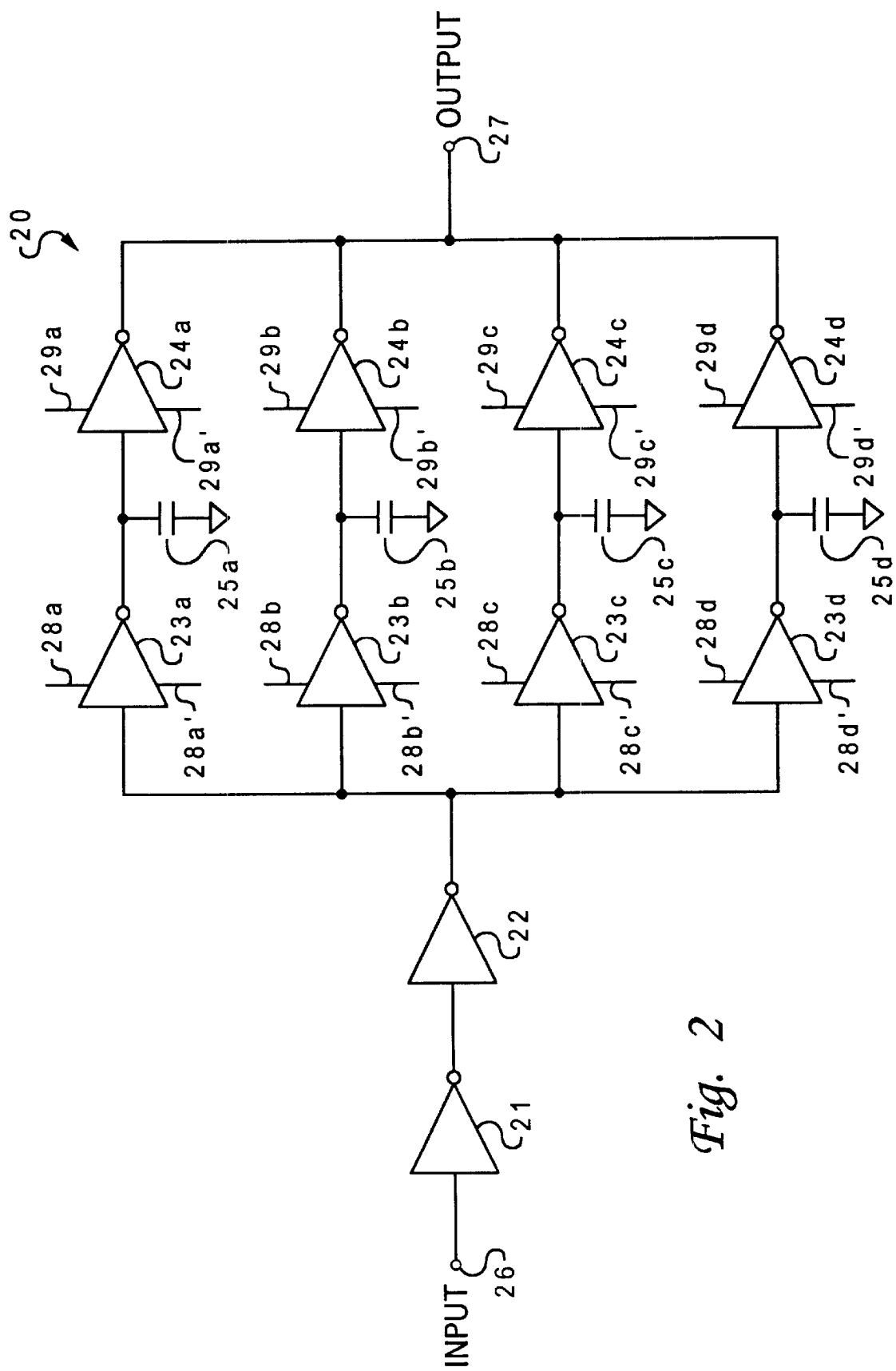
FIG. 2 is a schematic diagram of a driver circuit in accordance with a preferred embodiment of the present invention.

With reference now to FIG. 2, there is illustrated a schematic diagram of a driver circuit in accordance with a preferred embodiment of the present invention. As shown, a driver circuit 20 includes two conventional inverters 21–22 and eight impedance-controllable inverters 23a–23d, 24a–24d connected between an input 26 and an output 27. Each of conventional inverters 21–22 is comprised of a p-channel transistor and an n-channel transistor connected in series between a power supply and ground, as it is well-known in the art. Each of impedance-controllable inverters 23a–23d and 24a–24d has an up-level impedance control and a down-level impedance control. For example, impedance-controllable inverters 23a–23d have up-level impedance controls 28a–28d and down-level impedance controls 28a'–28d', respectively. Similarly, impedance-controllable inverters 24a–24d have up-level impedance controls 29a–29d and down-level impedance controls 29a'–29d', respectively. The up-level impedance controls and the down-level impedance controls within impedance-controllable inverters 23a–23d and 24a–24d will be further described in details.

In order to provide a shapable transition waveform, the output of inverter 22 within driver circuit 20 is in essence split into multiple paths. In the present embodiment, the output of inverter 22 is split into four paths, and each of the four paths has two impedance-controllable inverters connected in series. For example, the first path includes impedance-controllable inverters 23a and 24a along with a capacitor 25a; the second path includes impedance-controllable inverters 23b and 24b along with a capacitor 25b; the third path includes impedance-controllable inverters 23c and 24c along with a capacitor 25c; and the fourth path includes impedance-controllable inverters 23d and 24d along with a capacitor 25d. Capacitors 25a–25d are employed to provide an appropriate resistance-capacitance (RC) time constant with impedance-controllable inverters 24a–24d, respectively, at a predetermined time, as will be further described in details. The output of impedance-controllable inverters 24a–24d are connected together as output 27 for driver circuit 20. Thus, the output impedance of driver circuit 20 is equal to the combined impedance of impedance-controllable inverters 24a–24d. Although the output inverters (i.e., inverters 24a–24d) for driver circuit 20 are all impedance-controllable inverters, it is understood by those skilled in the art that inverters 24a–24d can be substituted with conventional inverters similar to inverters 21 and 22 without significantly affecting the characteristic of the output waveform at output 27.

Figure 3:
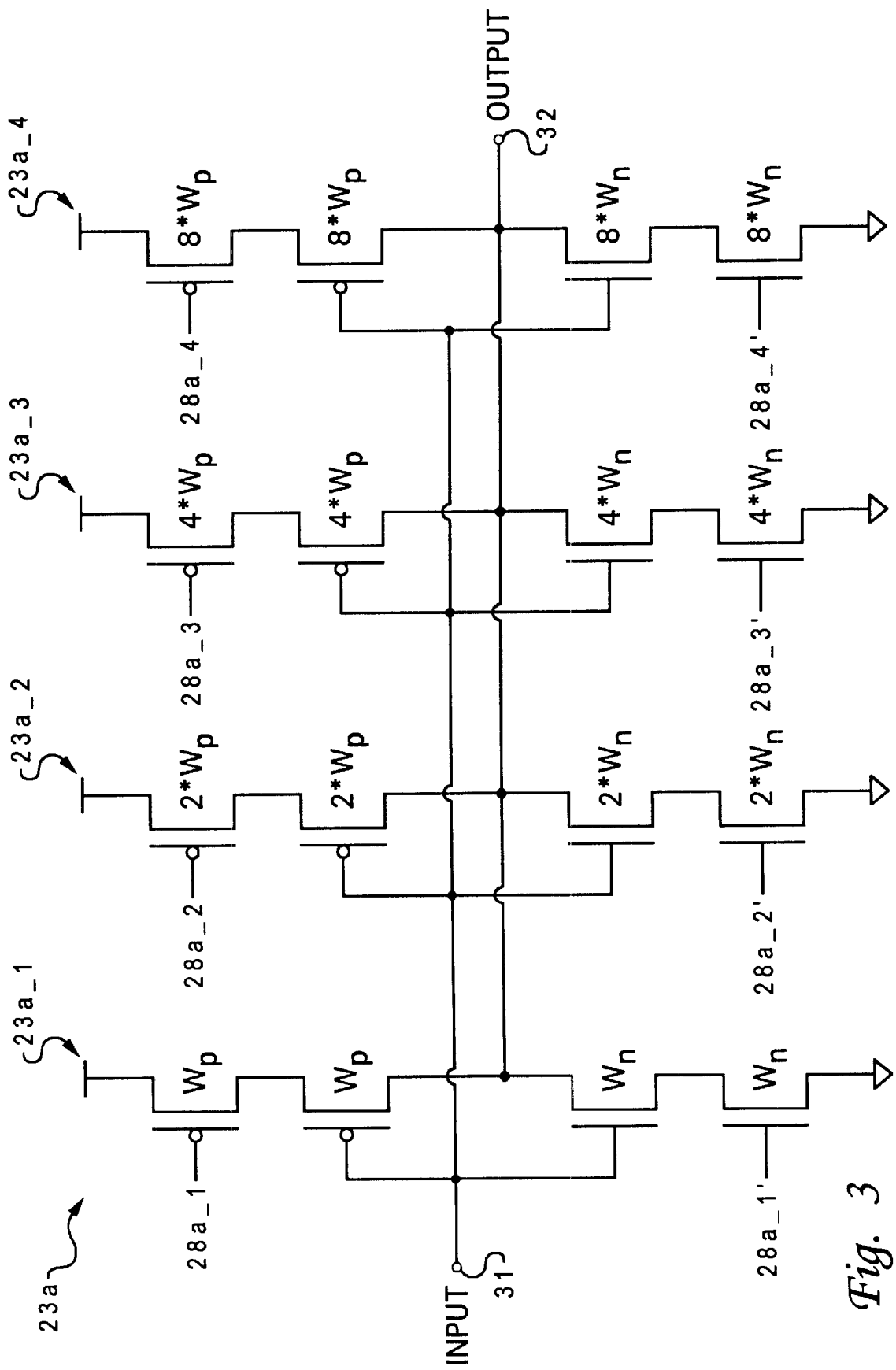
FIG. 3 is a schematic diagram of an impedance-controllable inverter within the driver circuit from FIG. 2, in accordance with a preferred embodiment of the present invention.

Since all impedance-controllable inverters 23a–23d and 24a–24d are similar to each other, only impedance-controllable inverter 23a will be further described in details. Referring now to FIG. 3, there is depicted a schematic diagram of impedance-controllable inverter 23a from FIG. 2, in accordance with a preferred embodiment of the present invention. As shown, impedance-controllable inverter 23a includes four inverters 23a_1, 23a_2, 23a_3, and 23a_4 connected in parallel. The input of inverters 23a_1, 23a_2, 23a_3, and 23a_4 are connected together to form an input 31. Similarly, the output of inverters 23a_1, 23a_2, 23a_3, and 23a_4 are connected together to form an output 32. Although only four inverters 23a_1–23a_4 are utilized within impedance-controllable inverter 23a, it is understood by those skilled in the art that any number of inverters may be utilized.

The up-level impedance of inverters 23a_1, 23a_2, 23a_3, and 23a_4 are controlled by controls 28a_1, 28a_2, 28a_3, and 28a_4, respectively. The down-level impedance of inverters 23a_1, 23a_2, 23a_3, and 23a_4 are controlled by controls 28a_1', 28a_2', 28a_3', and 28a_4', respectively. For example, the up-level impedance of impedance-controllable inverter 23a can be reduced by sending a logical low voltage to one or more of controls 28a_1–28a_4 to turn on one or more of the associated p-channel transistors. Similarly, the down-level impedance of inverter 23a_1 can be reduced by sending a logical high voltage to one or more of controls 28a_1'–28a_4' to turn on one or more of the associated n-channel transistors.

The gate widths of the transistors within inverters 23a_1, 23a_2, 23a_13 3, and 23a_4 are binary weighted. In the present embodiment, the gate widths of the two p-channel transistors and the two n-channel transistors within inverter 23a_1 are Wp and Wn, respectively; the gate widths of the two p-channel transistors and the two n-channel transistors within inverter 23a_2 are 2*Wp and 2*Wn, respectively; the gate widths of the two p-channel transistors and the two n-channel transistors within inverter 23a_3 are 4*Wp and 4*Wn, respectively; and the gate widths of the two p-channel transistors and the two n-channel transistors within inverter 23a_4 are 8*Wp and 8*Wn, respectively. Because of each inverters within impedance-controllable inverter 23a can be individually controlled, the total impedance of impedance-controllable inverter 23a can be controlled by separately controlling the up-level impedance and the down-level impedance of each inverter within impedance-controllable inverter 23a.

A controller (not shown) is preferably used to accurately activate the correct number of controls 28a_1, 28a_2, 28a_3, and 28a_4 for providing the proper up-level impedance, and to accurately activate the correct number of controls 28a_1', 28a_2', 28a_3', and 28a_4' for providing the proper down-level impedance for impedance-controllable inverters 23a.

Figure 4:
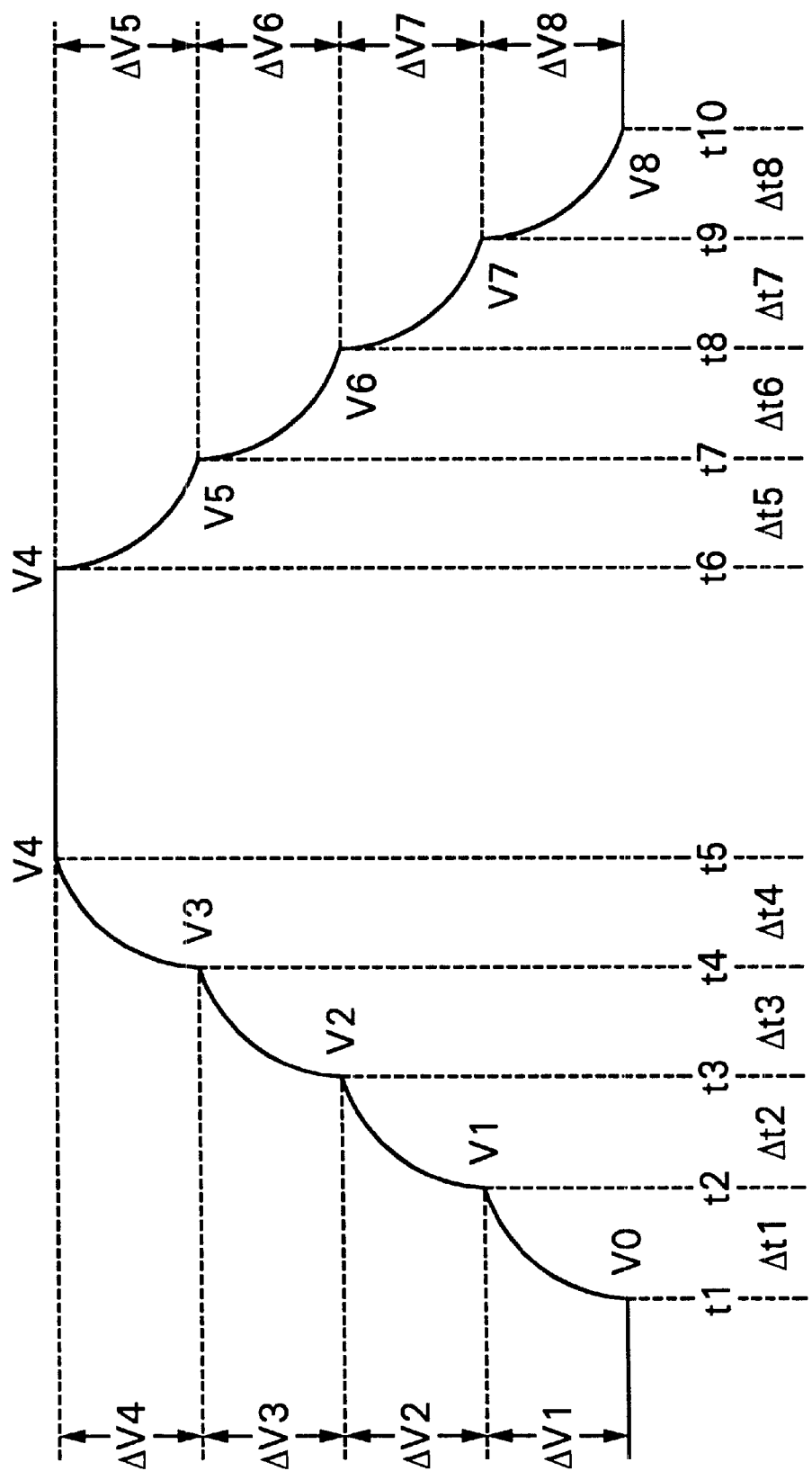
FIG. 4 is an exemplary transition waveform from the output of the driver circuit from FIG. 2, in accordance with a preferred embodiment of the present invention.

With reference now to FIG. 4, there is illustrated an exemplary transition waveform from output 27 of driver circuit 20 in FIG. 2. A customized timing signal for enabling an appropriate one of impedance-controllable inverters 23a–23d within drier circuit 20 can be generated by the above-mentioned controller. In this example, impedance-controllable inverters 23a–23d and 24a–24d are enabled via controls 28a–28d and 29a–29d in sequence at t1, t2, t3, and t4, respectively, for an up transition (i.e., rising edge) of a waveform. Similarly, impedance-controllable inverters 23a–23d and 24a–24d are enabled via controls 28a'–28d' and 29a'–29d' in sequence at t6, t7, t8, and t9, respectively, for a down transition (i.e., falling edge) of the same waveform. If the output of inverter 22 of the driver circuit 20 is a logical "1," after impedance-controllable inverters 23a and 24a have been enabled via controls 28a and 29a, respectively, at t1, the voltage at output 27 of driver circuit 20 moves up Δv1 during Δt1 (i.e., the time span between t1 and t2). Voltage increment Δv1 is approximately equal to z/(r1+z), where z is the transmission line impedance, r1 is the output impedance of inverter 24a. At t2, impedance-controllable inverters 23b and 24b are enabled via controls 28b and 29b, respectively. The voltage at output 27 of driver circuit 20 moves up Δv2 during Δt2 (i.e., the time span between t2 and t3). At t3, impedance-controllable inverters 23b and 24b are enabled via controls 28b and 29b, respectively. The voltage at output 27 of driver circuit 20 moves up Δv3 during Δt3 (i.e., the time span between t3 and t4). At t4, impedance-controllable inverters 23d and 24d are enabled via controls 28d and 29d, respectively. The voltage at output 27 of driver circuit 20 moves up Δv4 during Δt4 (i.e., the time span between t4 and t5). As a result, the shape of a rising edge of the output waveform from driver circuit 10 is convex upwards.

Conversely, at t6, impedance-controllable inverters 23d and 24d are enabled via controls 28a' and 29a', respectively. The voltage at output 27 of driver circuit 20 moves down Δv5 during Δt5 (i.e., the time span between t6 and t7). At t7, impedance-controllable inverters 23b and 24b are enabled via controls 28b' and 29b', respectively. The voltage at output 27 of driver circuit 20 moves down Δv6 during Δt6 (i.e., the time span between t7 and t8). At t8, impedance-controllable inverters 23c and 24c are enabled via controls 28c' and 29c', respectively. The voltage at output 27 of driver circuit 20 moves down Δv7 during Δt7 (i.e., the time span between t8 and t9). At t9, impedance-controllable inverters 23d and 24d are enabled via controls 28d' and 29d', respectively. The voltage at output 27 of driver circuit 20 move down Δv8 during Δt8 (i.e., the time span between t9 and t10).

If t1, t2, t3, t4 and Δv1, Δv2, Δv3, Δv4 or t6, t7, t8, t9 and Δv5, Δv6, Δv7, Δv8 are chosen in a controlled manner, then the signal transition waveform can be approximately customized to any desired shape. As a general rule, the higher the number of sub-sections for the pre-drive and output stage, the more flexibility to achieve the better the tolerance between the output waveform and the desired customized signal transition shape.

The transition times, such as t1, t2, t3, etc., are mainly determined by the customized timing signal from the above-mentioned controller. The transition time intervals Δt1, Δt2, Δt3, and Δt4 are mainly determined by the product of capacitance from capacitor 25a, capacitor 25b, capacitor 25c, and capacitor 25d, and the up-level impedance of impedance-controllable inverter 23a, impedance-controllable inverter 23b, impedance-controllable inverter 23c, and impedance-controllable inverter 23d, respectively. The up transition voltage differentials Δv1, Δv2, Δv3, and Δv4 are determined by the up-level impedance of impedance-controllable inverters 24a, 24b, 24c, 24d and the characteristic impedance of the transmission line. In the same manner, the starting positions of the down transition time t6, t7, t8, and t9 are mainly determined by the customized timing signal from the above-mentioned controller. The down transition voltage differentials Δv5, Δv8, Δv7, Δv8 are determined by the down-level impedance of impedance-controllable inverters 24a, 24b, 24c, 24d, and the characteristic impedance of the transmission line.

Figure 5:
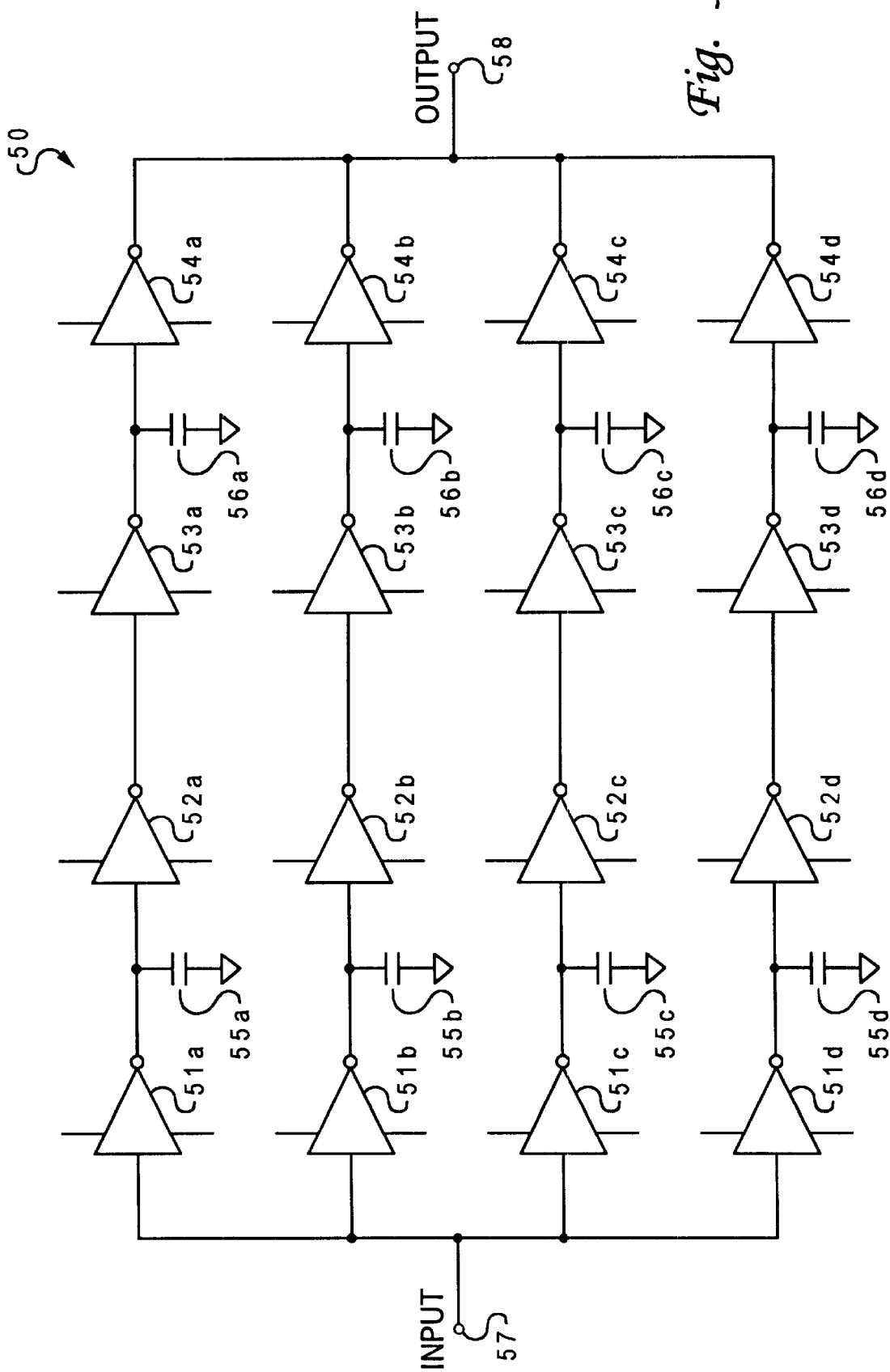
FIG. 5 is a schematic diagram of a driver circuit having two sets of time constants, in accordance with a preferred embodiment of the present invention.

In the above discussion, a customized timing signal is required to enable an appropriate impedance-controllable inverter at starting times t1–t4 for up transition of a signal and to enable an appropriate impedance-controllable inverter at the starting times t5–t8 for down transition of the signal. The requirement of such a customized timing signal can be eliminated by utilizing a driver circuit with two sets of RC time constant. Referring now to FIG. 5, there is depicted a schematic diagram of a driver circuit having two sets of RC time constants, in accordance with a preferred embodiment of the present invention. As shown, a driver circuit 50 includes 16 impedance-controllable inverters 51a–51d, 52a–52d, 53a–53d and 54a–54d connected between an input 57 and an output 58. Driver circuit 50 is essentially the extension of driver circuit 20 in FIG. 2 by replacing conventional inverters 21 and 22 with four impedance-controllable inverter pairs along with four capacitors. The RC time constant of the up transition impedance of impedance-controllable inverter 51a and the capacitance of capacitor 55a determine starting time t1. The RC time constant of the up transition impedance of impedance-controllable inverter 51b and the capacitance of capacitor 55b determine starting time t2. The RC time constant of the up transition impedance of impedance-controllable inverter 51c and the capacitance of capacitor 55c determine starting time t3. The RC time constant of the up transition impedance of impedance-controllable inverter 51d and the capacitance of capacitor 55d determine starting time t4. Similarly, the down transition impedance of impedance-controllable inverters 51a, 51b, 51c and 51d and the capacitance of the associated capacitors 55a, 55b, 55c and 55d determine starting times t5, t6, t7 and t8, respectively As has been described, the present invention provides a driver circuit having shapable transition signals. The basic concept of the driver circuit of the present invention is to control all internal impedances of the entire driver circuit with a controller. The impedance of a single inverter is replaced by several inverters connected in parallel, with their impedances in a binary weighted configuration. The controller is used to enable the correct combination of inverters to maintain the correct combined impedance. The pre-drive stage and output stage of the driver circuit are divided into several subsections. The output stage of the driver circuit of each sub-section is turned on at different time during signal transition. Therefore, although the shape of the rising and falling transition of each sub-section is convex up or concave down, but the overall shape of the signal transition will be approximately equal to any shape desired depending on the separation of turn-on time of the sub-output stage and the time constant of its input. The turn-on time of each section is controlled by controlling the resistance of the RC time constant. With thin gate oxide capacitance and well controlled device process, the variation of the resistance in the RC time constant is about 40% of the value of the RC time constant, while the variation of the capacitance in the RC time constant is about 10%. Generally speaking, capacitance, like impedance, can also be controlled by the controller if it is deemed to be necessary.

The signal transition shape of the driver circuit of the present invention can be customized to any preferred shape and is independent of the output impedance of the driver circuit. Furthermore, variation of parameters of the driver circuit, such as the impedance and signal transition shape, from one driver circuit to another is very small.

While the invention has been particularly shown and described with reference to a preferred embodiment, it will be understood by those skilled in the art that various changes in form and detail may be made therein without departing from the spirit and scope of the invention.

What is claimed is:

1. A driver circuit, comprising:
   a plurality of impedance-controllable inverters connected in parallel, wherein each of said plurality of impedance-controllable inverters includes an up-level impedance control and a down-level impedance control; and
   a plurality of capacitors, wherein each of said plurality of capacitors is coupled to an output of a respective one of said plurality of impedance-controllable inverters to provide an output for said driver circuit.

2. The driver circuit of claim 1, wherein one of said plurality of impedance-controllable inverters has a different gate width from another one of said plurality of impedance-controllable inverters.

3. The driver circuit of claim 1, wherein one of said plurality of impedance-controllable inverters has two p-channel transistors connected in series with two n-channel transistors between a power supply and ground.

4. The driver circuit of claim 3, wherein the gates of said two p-channel transistors are connected to said up-level impedance control, and the gates of said two n-channel transistors are connected to said down-level impedance control.

5. A driver circuit, comprising:
   a first set of impedance-controllable inverters connected in parallel, wherein each of said first set of impedance-controllable inverters includes an up-level impedance control and a down-level impedance control;
   a second set of impedance-controllable inverters connected in parallel, wherein each of said second set of impedance-controllable inverters includes an up-level impedance control and a down-level impedance control, wherein each of said second set of impedance-controllable inverters is connected in series with a respective one of said impedance-controllable inverters within said first set; and
   a plurality of capacitors, wherein each of said plurality of capacitors is connected to an output of a respective one of said impedance-controllable inverters within said first set.

6. The driver circuit of claim 5, wherein one of said plurality of impedance-controllable inverters within said first set has a different gate width from another one of said plurality of impedance-controllable inverters within said first set.

7. The driver circuit of claim 5, wherein one of said plurality of impedance-controllable inverters within said second set has a different gate width from another one of said plurality of impedance-controllable inverters within said second set.

8. The driver circuit of claim 5, wherein one of said plurality of impedance-controllable inverters within said first set has two p-channel transistors connected in series with two n-channel transistors between a power supply and ground.

9. The driver circuit of claim 8, wherein the gates of said two p-channel transistors are connected to said up-level impedance control, and the gates of said two n-channel transistors are connected to said down-level impedance control.

10. The driver circuit of claim 5, wherein one of said plurality of impedance-controllable inverters within said second set has two p-channel transistors connected in series with two n-channel transistors between a power supply and ground.

11. The driver circuit of claim 10, wherein the gates of said two p-channel transistors are connected to said up-level impedance control, and the gates of said two n-channel transistors are connected to said down-level impedance control.

* * * * *